US006437360B1

(12) United States Patent
Cho et al.

(10) Patent No.: US 6,437,360 B1
(45) Date of Patent: Aug. 20, 2002

(54) VACUUM FIELD TRANSISTOR

(75) Inventors: Gyu Hyeong Cho, Taejon; Ji Yeoul Ryoo, Taejon-si; Myeoung Wun Hwang, Kyounggi-do; Min Hyung Cho, Taejon; Young Jin Woo, Taegu-si; Young Ki Kim, Suwon-si Kyounggi-do, all of (KR)

(73) Assignee: Korea Advanced Institute of Science and Technology (KR)

(*) Notice: Subject to any disclaimer, the term of this patent is extended or adjusted under 35 U.S.C. 154(b) by 0 days.

(21) Appl. No.: 09/647,076

(22) PCT Filed: Mar. 25, 1999

(86) PCT No.: PCT/KR99/00132

§ 371 (c)(1),
(2), (4) Date: Nov. 9, 2000

(87) PCT Pub. No.: WO99/49520

PCT Pub. Date: Sep. 30, 1999

(30) Foreign Application Priority Data

Mar. 25, 1998 (KR) ........................................... 98-10337
Mar. 17, 1999 (KR) ........................................... 99-8922

(51) Int. Cl.[7] .......................... H01L 29/06; H01L 29/76
(52) U.S. Cl. .......................... 257/10; 257/328; 257/407
(58) Field of Search .......................... 257/10, 328, 407; 438/22; 313/310, 336, 351

(56) References Cited

U.S. PATENT DOCUMENTS 4,732,659 A * 3/1988 Schachter et al. ..... 204/192.25
5,012,153 A 4/1991 Atkinson et al.
5,077,597 A 12/1991 Mishra
5,214,347 A * 5/1993 Gray .......................... 313/355
5,466,982 A 11/1995 Akinwande

FOREIGN PATENT DOCUMENTS

JP 5-29411 * 2/1993
JP 8-335589 * 12/1996

* cited by examiner

*Primary Examiner*—Steven Loke
*Assistant Examiner*—Hung Kim Vu
(74) *Attorney, Agent, or Firm*—Bachman & LaPointe, P.C.

(57) ABSTRACT

Disclosed are flat/vertical type vacuum field transistor (VFT) structures, which adopt a MOSFET-like flat or vertical structure so as to increase the degree of integration and can be operated at low operation voltages at high speeds. The flat type comprises a source and a drain, made of conductors, which stand at a predetermined distance apart on a thin channel insulator with a vacuum channel therebetween; a gate, made of a conductor, which is formed with a width below the source and the drain, the channel insulator functioning to insulate the gate from the source and the drain; and an insulating body, which serves as a base for propping up the channel insulator and the gate. The vertical type comprises a conductive, continuous circumferential source with a void center, formed on a channel insulator; a conductive gate formed below the channel insulator, extending across the source; an insulating body for serving as a base to support the gate and the channel insulator; an insulating walls which stand over the source, forming a closed vacuum channel; and a drain formed over the vacuum channel. In both types, proper bias voltages are applied among the gate, the source and the drain to enable electrons to be field emitted from the source through the vacuum channel to the drain.

16 Claims, 15 Drawing Sheets

(a) bidirectional enhancement type with connected gate (b) unidirectional enhancement type (c) bidirectional enhancement type (e) bidirectional depletion type with connected gate (f) unidirectional depletion type (g) bidirectional depletion type L=0.5um

VACUUM FIELD TRANSISTOR

BACKGROUND OF THE INVENTION

1. Field of the Invention

The present invention relates to flat/vertical type vacuum tunneling transistors. More particularly, the present invention relates to flat/vertical type vacuum tunneling transistors which adopt a MOSFET-like flat or vertical structure so as to increase the degree of integration and can be operated at low operation voltages with high speeds.

2. Background of the Invention

In conventional semiconductor devices, the flow of current is conducted within semiconductors, so the moving velocity of electrons is affected by the crystal lattices or impurities therein. Recently, there have been developed semiconductor devices which comprise microtip type vacuum transistors. In such a vacuum transistor, electrons move in vacuum and thus, at non-limited speeds. Therefore, the vacuum transistors can be operated at ultra speeds. However, they suffer from disadvantages in that they are difficult to integrate on a mass scale and require relatively high voltages for their operation.

In order to better understand the background of the invention, a description will be given of conventional techniques in conjunction with the drawings.

With reference to FIG. 1, there is a basic structure of a MOSFET (n-channel). Typically ranging, in upper operation frequency (ft), from 20–30 GHz, Si FETs of this structure show a lamination of being applied only for the voltage-controlled oscillators (VCO) with several GHz, but not for the oscillators with extreme high frequency of several tens GHz. For SOI and GaAs FETs, they can be used at higher frequencies, but also suffer from disadvantages in that they are difficult to fabricate and expensive.

In detail, when a gate G and a drain D are applied with a voltage with a source S being grounded in the MOSFET structure of FIG. 1, a space charge region is formed below a gate G in a body B. If the voltage exceeds a threshold voltage, a channel P is formed beneath the gate G. The MOSFET in this state is said to be electrically conducted. For an n-channel MOS, electrons move along the channel from the source S to the drain D. The operation speed of the device is inversely proportional to the time which it takes for the electrons to move from the source S to the drain D. Thus, the shorter the channel is, the faster the electrons move. The frequency ft, indicating the speed of a device, at which the current gain is 1 upon grounding the drain, is approximately proportional to the mobility ($\mu$) of electrons and inversely proportional to the square of a channel length.

Notice is taken of the mobility ($\mu$) among the factors which determine the speed of a device. The mobility depends on the materials of the channel. For example, as long as the applied electric field is below $5\times10^4$ ([V/cm]), the mobility is about 5 times faster in GaAs than in Si. GaAs is therefore used to fabricate high speed transistors. Above all, however, if the lattice structure of the channel region is removed, that is, if the channel region is in a vacuum, the mobility does not act as a limitative factor any longer. Accordingly, it is expected that stronger electric fields could make faster the operation speed of the device which has a vacuum channel region.

With reference to FIG. 2, there is a conventional vacuum transistor with a microtip, which is modified from a field emission display (FED) structure. With a frequency (ft) of approximately 1 THz, this vacuum transistor can be applied for the extreme high frequency devices for which conventional FETs are unable to be applied.

As seen in this figure, electrons are emitted from a sharp-pointed cathode emitter under the influence of a high accelerating potential ranging from tens of volts of 100 volts or higher and are controlled by a phospher screen places over a common anode. The number of the electrons which move toward the anode are controlled by applying tens of volts to a gate. The reason why such high voltages are required to control and emit electrons is that the tip is apart from the gate at a relatively long distance. Together with the high anode and gate voltages, the difficulty in making such a microtip limits these vacuum transistor structures within particular applications, e.g. military use.

SUMMARY OF THE INVENTION

Therefore, it is an object of the present invention to overcome the above problems encountered in prior arts and to provide a novel flat/vertical type vacuum tunneling transistor, which allows a high degree of integration.

It is another object of the present invention to provide a novel flat/vertical type vacuum tunneling transistor, which can be operated at a very low voltage with high speeds.

The present invention adopts a MOS transistor-like flat or vertical structure, instead of a conventional microtip structure, so as to increase the integration degree, and recruits a low work function material to induce an tunneling effect under a lower voltage. In addition, the present invention is structured in such a way that electrons travel a vacuum free space, thereby realizing the high speed operation of devices. In conventional devices, such as Si and GaAs devices, electrons flow through the lattices consisting of Si or GaAs atoms. In result, the electrons collide with the atoms or impurities added, so they cannot freely move, but show limited mobility.

As a result of the intensive and thorough research on a novel vacuum transistor, repeated by the present inventors, a novel flat/vertical vacuum tunneling transistor which meets the above conditions, was developed and named "Vacuum Field Transistor" (hereinafter referred to as "VFT").

In accordance with an aspect of the present invention, there is provided a flat type vacuum field transistor, comprising a source and a drain, made of conductors, which stand at a predetermined distance apart on a thin channel insulator with a vacuum channel therebetween; a gate, made of a conductor, which is formed with a width below the source and the drain, the channel insulator functioning to insulate the gate from the source and the drain; and an insulating body, which serves as a base for propping up the channel insulator and the gate, wherein proper bias voltages are applied among the gate, the source and the drain to enable electrons to be field emitted from the source through the vacuum channel to the drain.

Preferable is the flat type vacuum field transistor comprising a low work function material at the contact regions between the source and the vacuum channel and between the drain and the vacuum channel.

Particularly preferable is a VFT structure in which each VFT device is installed in a trench consisting of septal walls in order that the electrons emitted from a source by a tunnel effect should not move through the vacuum free space toward neighboring drains.

In another aspect of the present invention, there is provided a vertical type vacuum field transistor, comprising; a conductive, continuous circumferential source with a void center, formed on a channel insulator; a conductive gate formed below the channel insulator, extending across the source; an insulating body for serving as a base to support the gate and the channel insulator; insulating walls which stand over the source, forming a closed vacuum channel; and a drain formed over the vacuum channel, wherein proper bias voltages are applied among the gate, the source and the drain to enable electrons to be filed emitted form the source through the vacuum channel to the drain.

Particularly preferable is the vertical type vacuum field transistor which further comprises a low work function material coated on the source.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1:
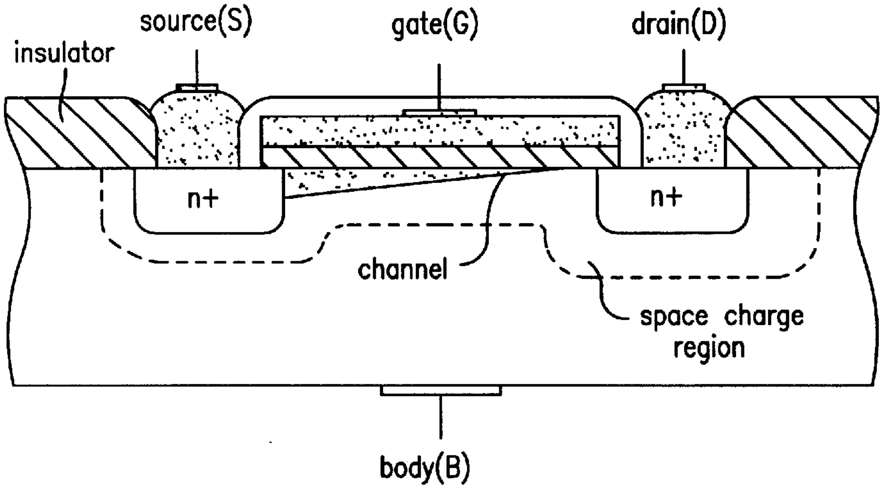
FIG. 1 PRIOR ART
FIG. 1 is a schematic cross sectional view showing a conventional MOSFET.

The application of the preferred embodiments of the present invention is best understood with reference to the accompanying drawings, wherein like reference numerals are used for like and corresponding parts, respectively.

Figure 3A:
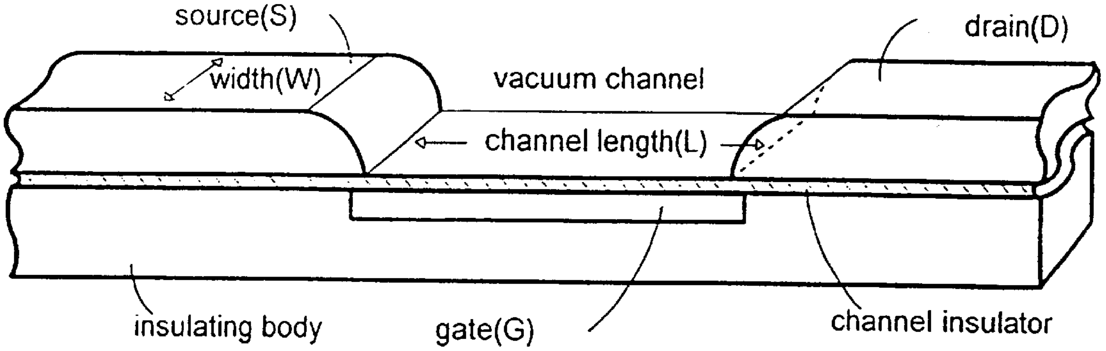
FIGS. 3*a* and 3*b* show a fundamental structure of a VFT in a perspective view and a cross sectional view, respectively. The VFT is similar to a MOSFET, but different in that a channel becomes void and exchanged for a gate in position.
Figure 3B:
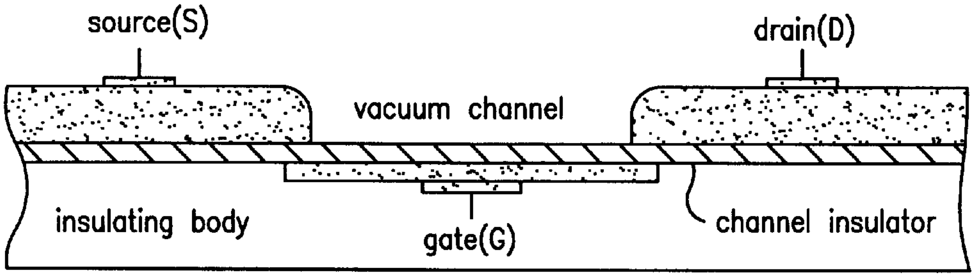

Referring to FIGS. 3*a* and 3*b*, there is a structure showing the fundamental concept of a VFT according to the present invention, in a perspective view and a cross sectional views, respectively. This VFT structure seems like a MOSFET structure, but is different in that a channel is made to be void and exchanged for a gate in position. This VFT structure is divided into a supra structure comprising a source S, a drain D and a vacuum channel therebetween, and an infrastructure comprising a gate G and a body. The source S, the drain D and the gate G each are an electric conductor with a thin channel insulator between the supra structure and the infrastructure. The vacuum channel is over the gate G which is located in the insulating body which supports the entire device.

Figure 2:
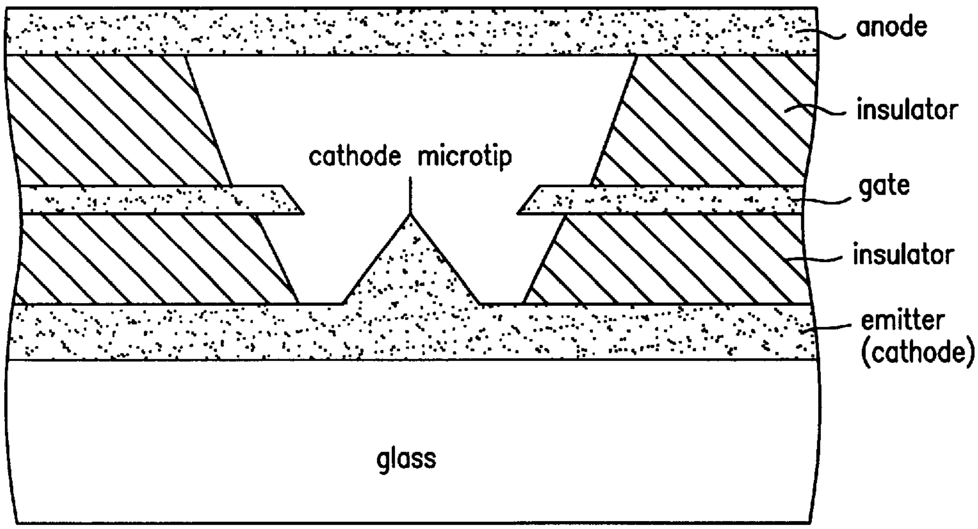
FIG. 2 PRIOR ART
FIG. 2 is a schematic view showing a conventional microtip type vacuum transistor.

To the question whether, if a voltage is applied to the gate G, a channel will be formed and a current will flow easily, in this structure, as in a MOSFET structure, it is not simple to give an answer. The reason is that, because the channel is in a vacuum state, it is not easy to draw into a free space the electrons which lodge inside metal lattices. For a MOSFET, when there is applied a gate voltage large enough to surmount the relative Fermi level between the $n^+$region and p region of Si, the threshold condition is satisfied to form a channel and thus, it is unnecessary to draw the electrons of a source S into so far a free space. In contrast to the MOSFET structure, the novel structure according to the present invention comprises the channel which is in a vacuum state, thus requiring the drawing of electrons into a free space. THIS is related to the work function which indicates the force by which electrons are confined within metals. So, the electric field needed to draw the electrons is dependent on the kind of the metals used, but is generally required to be strong. It is therefore very important to understand how the emission of electrons is related to the intensity of the electric field applied. Recently, study has been made on devices which can be operated under this principle. In result, a microtip type vacuum transistor, a unit element composing a field emission display, was developed, whose structure is schematically shown in FIG. 2.

Electron emission from a metal to a vacuum is easily effected by an intensive electric field. In detail, when applying a potent electric field on a metal, the height and width of a potential barrier on the metal surface are reduced, so as to allow the tunnel effect to take place easily. Metals used in tip type field emission elements typically range, in work function, from approximately 3 to 5 eV. Thus, the intensity of the electric field necessary to emit electrons from such a metal must be at least $10^7$ [V/cm]. However, particular metal compounds show a work function as low as about 0.1–1 eV, allowing an electric current to flow with a similar rate under an electric field of $10^5$ [V/cm]. In fact, like diamond, some non-metallic compounds show a work function much less than this value. In accordance with the present invention, these materials are utilized to effect the electron emission. Such material as are low in work function are used as source materials or thinly coated on the source to give a VFT which can be operated at low voltages.

Figure 4:
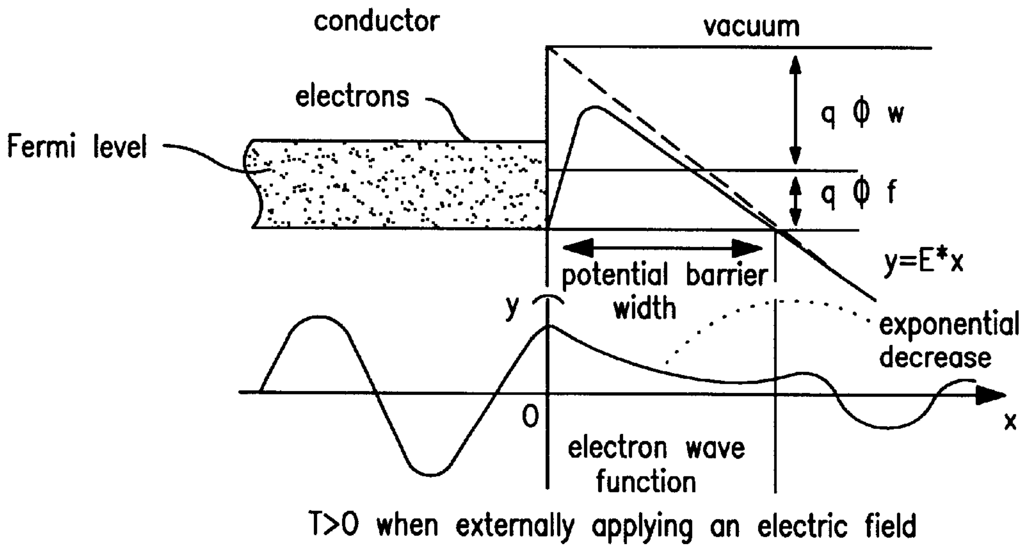
FIG. 4 is a graph showing how a potential barrier and an electron density probability function change with the electric field applied externally when electrons in a conductor are activated to more than the Fermi level by a thermal energy at room temperature.

Referring to FIG. 4, there is shown a tunneling effect by which electrons are transmitted from a metal to a vacuum when externally applying an electric field to the metal at room temperature. If an infinite potential barrier exists, the probability that electrons might exist outside the metal is zero. However, where an intensive electric field is applied, the potential barrier is lowered in height and narrowed in width so that the probability of electrons existing in the vacuum is not zero. In other words, some electrons may run forward to the vacuum by themselves. At this time, the current density of the electrons emitted from the metal follows the Fowler-Nordheim equation represented by the following mathematical equation I;

$$J = 1.54\times 10^{-6}\cdot\frac{E^2}{\phi\times t(y)^2}\cdot e^{-6.83\times 10^{i}\times\frac{\phi^{\frac{3}{2}}\times v(y)}{E}}\ [\mathrm{A/cm^2}] \qquad [I]$$

Wherein ϕ is a potential difference relating the work function of a metal, t(y) is an elliptic function in respect to the image force of the electrons emitted, v(y) is an elliptic function of nearly 1, and E is the intensity of the electric field applied on a metal surface. Occasionally, trivial protrusions may be on the metal surface. On the protruded surfaces, the electric field is more intensified, so that more electrons can be emitted therefrom.

Returning to FIG. 3, the fundamental structure of the VFT according to the present invention allows the electrons emitted from the source S to determine the electric currents. The amount of emitted electrons depends on the combination of the intensity of the electric field at the vicinity of the boundary between the vacuum channel and the source S as well as on the work function of the conductor material for the source S. The intensity of the electric field at the vicinity of the fringe of the source S is a function of the potential applied across the gate G and the source S and a function of the thickness of the channel insulator therebetween.

Hence, if the work function (qϕ) of the source metal S and the intensity of the electric field are given, the current density (J) can be calculated from the mathematical equation I. As inferred form the equation, the recruitment of a material of a low work function for the source and the increase of the E by raising the voltage between the gate G and the source S($V_{GS}$), can give rise to an increase in the current density. If the source S is made of tungsten (W) or molybdenum (Mo), its work function is approximately 4.5 eV, too large to give preferably current densities. On the other hand, where a low work function material, e.g., diamond or diamond-like carbon, is used for the source S, a desirable current density can be attained even under very low electric fields. In consideration of the conductivity and process ability of the low work function material, alternatively, the source S is primarily made of a material good in conductivity and then, coated with the low work function material.

With reference to FIG. 5, there are examples of the low work function work material coated structure as afore-illustrated. In contrast to conventional vacuum transistor structures, the structure of FIG. 5 shows an ability to sufficiently intensify the electric field applied around the electron emitting region, e.g., around the verge of the source in contact with the channel, under the condition of a low gate voltage. This ability comes from the fact that the channel insulator between the gate G and the source S is very thin and the existence of an insulator with a dielectric constant ($\epsilon_r$) between the gate G and the source S leads to the amplification of the electric field in the vacuum channel by $\epsilon_r$ fold by the same voltage. In addition, if a metal surface has a small curvature radius, the electric field on the curved surface becomes strong. Based on this fact, the electric field can be intensified by modifying the radius of curvature of the verge at which the source S is in contact with the channel in the structures illustrated in FIG. 5.

As in typical MOSFETs, the Early effect may take place in the VFT. For this reason, where the length between the source and the drain is shortened, the electric field abandoned by the drain voltage may enable more electrons to be emitted from the low work function material on the source.

Figure 5A:
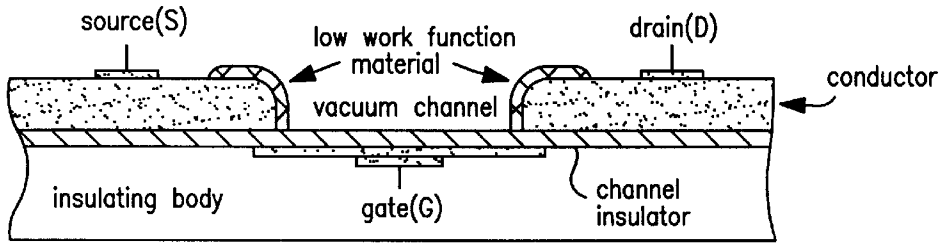
FIGS. 5*a* and 5*b* show the application of a low work function material to a source, a drain and/or a gate at their contact regions with a vacuum channel in a VFT structure.

In order to prevent this effect, the entire surface of the low work function material coated on the source, except for the spot from which most electrons are emitted, may be covered with a metal to shield the electric field abandoned by the drain. This structure is shown in FIG. 5*c*. As seen in FIG. 5*c*, a low work function material is coated on a part of the source S and then, covered with a metal layer in such a way that it is connected to the source S to have the same potential.

Figure 5B:
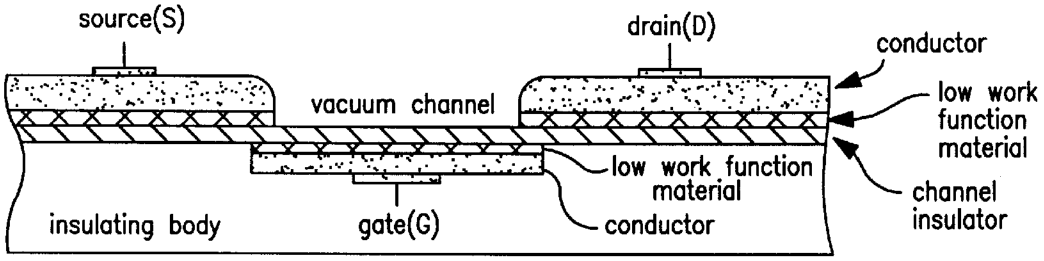
Figure 5C:
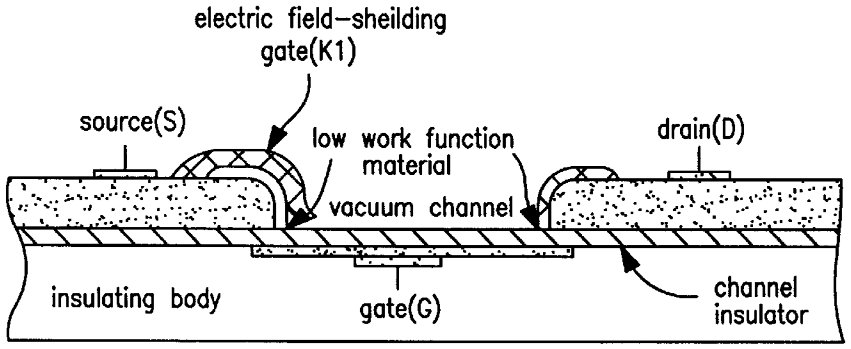
FIG. 5*c* shows an application of an electric field-shielding conductor on the low work function material in the structure of FIG. 5*a;*

FIG. 5*b* shows that a source S is overlaid on a low work function material. In this case, prior to depositing the source S, an insulator may be formed on a predetermined area of the low work function material. After a metal layer for the source S is deposited, the insulator is etched off, so as to expose the spot of the low work function material, from which electrons are emitted.

Figure 5D:
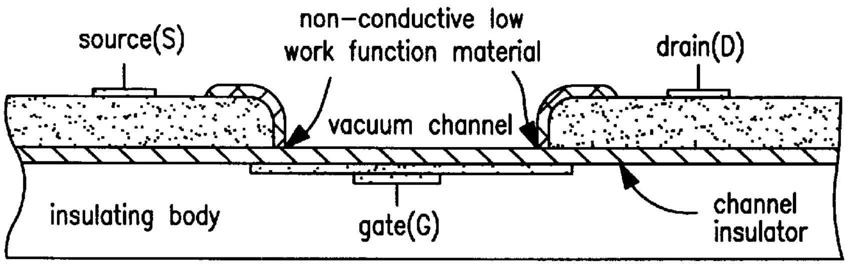
FIG. 5*d* shows the application of a non-conductive low work function material over a region from a source through a channel to a drain in a VFT structure.

A structure using a non-metallic low work function material, such as diamond-like carbon, is exemplified in FIG. 5*d*. As seen, the non-metallic low work function material is thinly continuously coated over an area from a source S through a vacuum channel to a drain D. This structure allows the electron emission from the source S to occur easily and has an advantage of being easily fabricated. The structure in which the drain is connected to the source via the low work function material can be applied for the cases of FIG. 5*b* and 5*c*. The low work function material is coated on the channel insulator in the channel region to realize the connection between the source and drain.

In the case of coating a low work function material on a conductor, problems attributable to the difference in work function between the two materials will be described, below, along with the problems which may occur when the work function of the gate conductor is different from that of the source conductor. In addition, where the wire which connects the gate to the source has a different work function form those of the gate source, the following description will contain the problems which may occur at such a junction between heterogeneous conductors.

Let's assume that two conductors, which are different in work function, make a junction with each other at different spacings with an insulator therebetween. Where the spacings between the two conductors are $d_{m1}$ and $d_{m2}$, respectively, if $d_{m1<<}d_{m2}$, the work function difference between the two conductors is represented as follows: $q\Delta\phi_m = q\Delta\phi_{m1} - q\Delta\phi_{m2}$ wherein $\Delta\phi_m$ means the potential difference between the two conductors. When the potential difference, $\Delta\phi_{m,}$ is produced across two conductors with an insulator therebetween, a certain quantity of charges ($\pm\Delta Q$) exist at the interfaces between the two conductors and the insulator while an electric field E is produced inside the insulator. Under this condition, when a voltage is externally applied across the two conductors, electrons easily penetrate the insulator by virtue of the tunneling effect if the spacing is short $d_{m1}$. On the other hand, the long spacing,$d_{m2}$, of the insulator makes it virtually impossible for the electrons to move through the insulator unless the voltage is extremely great.

Returning to FIG. 5 with this situation in mind, the source is assumed to be connected to the gate via a wire. In the resulting structure, junctions between the source and the gate are shown in expanded views of FIG. 6. In the figure, it is assumed that the source S, the gate G, the drain D and the wire all are the same conductor and a part of the source S is coated with a conductive, low work function material. Along the dotted line, a "source-junction#1-low work function material-junction#2-gate" structure is formed. That is, forming a close loop, two kinds of metals are connected to each other with two junctions therebetween.

Because the junction#1 has almost no spacing ($d_{m1}\approx 0$), the source is in direct contact with the gate. Therefore, though there exists a potential difference attributable to the different work functions between the two metals, electrons freely move between the two metals by virtue of the tunneling effect. This junction is called ohmic contact.

At the junction#2 between the low work function material and the gate G, however, the tunneling effect cannot be expected and thus, the moving of electrons does not take place because, in contrast to the junction#1, the function#2 has a great spacing ($d_{m1} << d_{m2}$). Nonetheless, between the low work function material and the gate G is the potential difference corresponding to their work function difference. Thus, charges $\pm\Delta Q$ are at the respective interfaces of the insulator. Across the insulator, as shown in the expanded partial view of FIG. 6*a*, $+\Delta Q$ and $-\Delta Q$ exists at the side of the low work function material and at the side of the gate G, respectively, making the internal electric field of the insulator be directed form the source S toward the gate G.

Having an inhibitory influence on the electron emission from the source S, this direction of the electric field causes an offset voltage, which must be overcome when the element is intended to operate by applying a potential across the gate G and the source S. Compared to a conventional MOSFET, this structure has a threshold voltage which is higher by $\Delta\phi$. In order to reduce the threshold voltage, the conductor for the gate must also be selected from materials of low work functions.

Figure 6A:
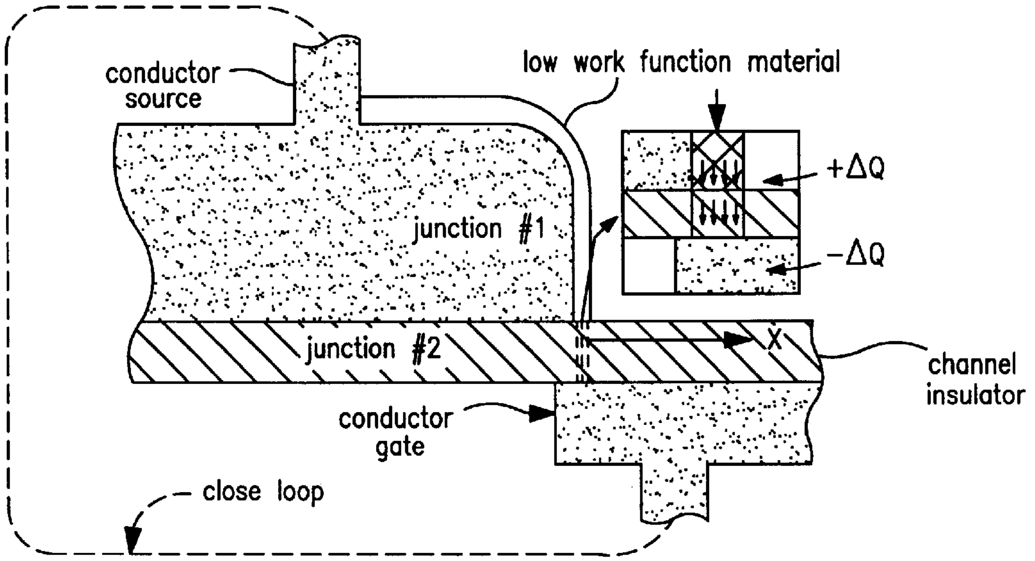
FIG. 6*a* shows a closed loop which is formed by connecting a gate to a source via a wire and the charges and electric fields which exist between metal junctions in a VFT structure.
Figure 6B:
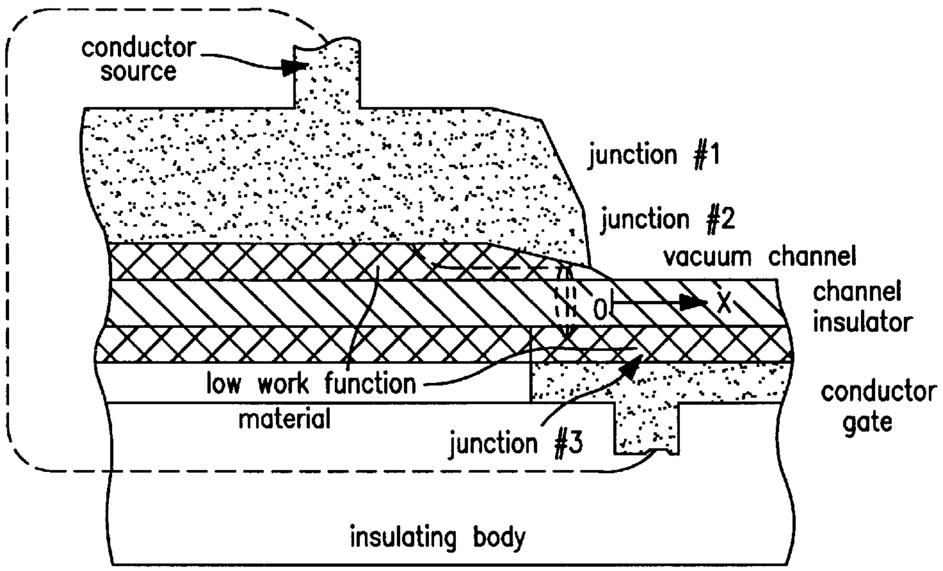
FIG. 6*b* shows an application of a low work function material to the interfaces between the source and the channel insulator and between the gate and the channel insulator in the VFT structure of FIG. 6*a;*

Turning now to FIG. 6*b*, the same material as is coated on the side of the source, is used on the side of the gate and underlaid by a conventional conductor (Al). In this structure, there no longer exists an offset voltage between the source S and the gage G because a junction#3 which is formed on the side of the gate S is an ohmic contact, like the junction#1. In result, the problem of increasing the threshold voltage can be solved by this manner. In addition, the structure of FIG. 6*b* is characterized in that a low work function material is coated not on a source S, but on a channel insulator and then, coated with a conductor for a source S. This structure is also operated in the same manner as described above.

Now, there will be discussed whether electrons can be emitted form the low work function material on the side of the source S toward the channel. The direction toward the drain D is set at the X direction with the starting point at the end of the low work function material, as shown in FIGS. 6*a* and 6*b*. In order to transmit electrons at x=0 from the low work function material to the channel, the work function difference between the low work function material and the channel must be surmounted. Because the channel has a vacuum level, the problem is how the electrons surmount the work function of the low work function material itself. This is approached by applying a voltage across the gate G and the source S on the basis of the tunneling effect as illustrated in FIG. 4. If a potential difference exists between the gate G and the source S, the intensity of the internal electric field of the insulator is approximately determined form the formula E=V/d. In the x direction exists an electric field, called "fringing field". The intensity of the fringing field is maximal at the point x=0 and is weakened as it becomes distant form the source S (x >0).

Figure 7:
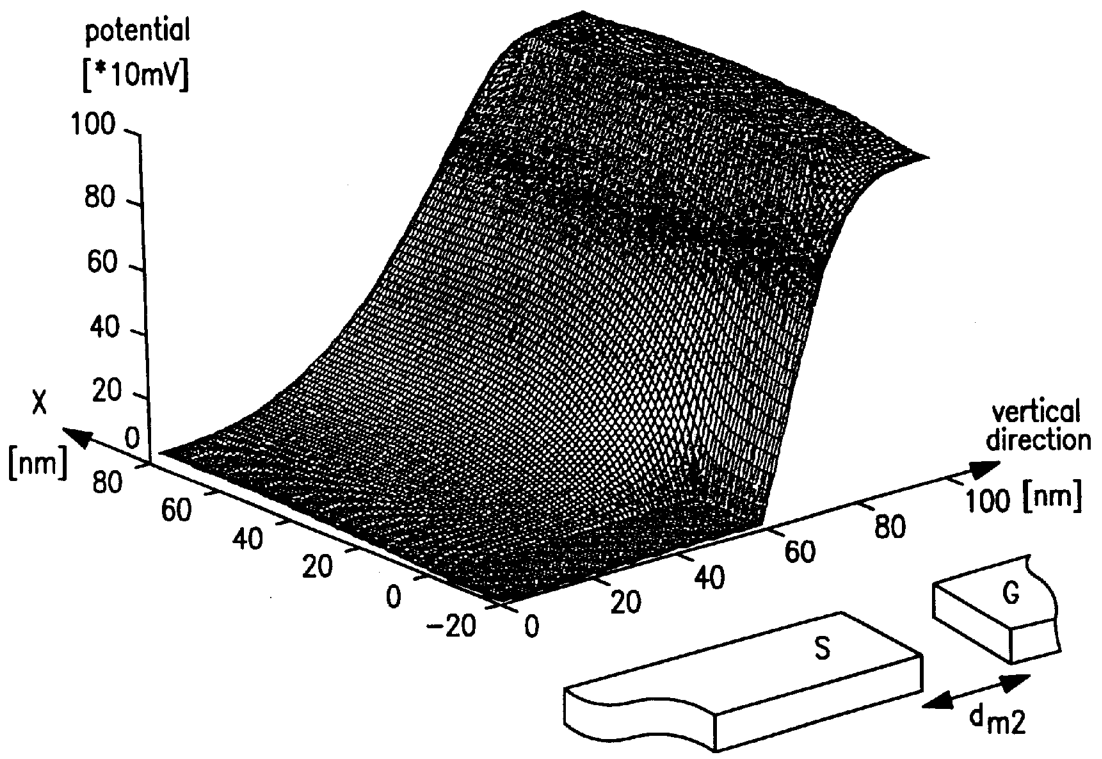
FIG. 7 is a simulation result for the potential change upon applying 1 volt across the gate and source in the VFT structure, obtained by a finite division method.

FIG. 7 shows this pattern. In this figure, when 1 V is applies across the source S and the gate G on the assumption that the source S and the gate G are made of the same material with a spacing ($d_{m2}$) of 20 nm therebetween and a vacuum is used instead of the insulator, potential distributions are plotted against the distance on the x axis. The most important is the electric field intensity at the vicinity of x=0. The stronger this intensity is, the more easily the tunneling occurs on the basis of the principle illustrated in FIG. 4. The current flow thus generated is allowed to be expected to a considerable extent with the aid of the mathematical equation I.

The result of FIG. 7 was obtained, as aforementioned, by regarding as a vacuum the insulating layer between the source S and the gate G, but is quite different from the practice owing to the dielectric constant. For instance, in the case of forming the insulator with $SiO_2$, because $SiO_2$ has a dielective constant $\epsilon_r \approx 4$, the spacing $d_{m2}$ between the source and the gate must be extended by $\epsilon_r$ times, e.g. to 80 nm in order to provide the same magnitudes as in FIG. 7 to the electric field in the x direct on under the same conditions as described above. Therefore, the intensity E of the electric field within the insulating layer $SiO_2$ is reduced to one quarter against the same voltage difference 1V across the gate-source when the spacing $d_{m2}$ is extended by four time. Nonetheless, the electric flux density D remains unchanged because the electric flux density shows the relation $D=\epsilon_r\epsilon_o E$. Generally, the electric flux D follows the path, the gate-the insulator-a partial vacuum channel-the source and becomes weak as the path penetrating through the vacuum is long. However, when considering the boundary condition on the fringe of the source electrode, it is reasonable to understand that the electric flux density D on the fringe of vacuum channel which is in contact with he source is not quite different from that within the adjacent insulator. Thence, the electric field E is more intensified by approximately $\epsilon_r$ times on the fringe of the vacuum channel in contact with the source than within the adjacent insulator. In other words, the electric field E is the strongest on the fringe of the vacuum channel at the vicinity of the starting point x=0 and tends to be weakened as x is large.

In result, the electron emission from the low work function material on the side of the source S is performed in such a way that electrons are emitted from the fringe (x×0) in contact with the channel into the fringe of the vacuum channel, at which the eclectic field is the most intensive. The emitted electrons are attracted by the potential applied to the gate, so as to accumulate on the insulating layer of the channel region. Under this circumstance, a part of the charges flow off by the action of the drain D potential while the same quantity of charges are supplied from the source, thereby forming a current flow. As long as a considerably high voltage is not applied by the thickness of the insulating layer and the surface energy level formed on the insulating layer, the charges which are accumulated on the insulating layer of the channel as a result of the emission to the vacuum do not easily experience the tunneling toward the gate G. Therefore, the voltage range which can be safely applied to the gate, is a function of the kind and thickness of the insulating layer.

The above description is responsible for a conductive low work function material-coated source S. For a non-conductive material coating, e.g. diamond or diamond like carbon coating, difficulty is given to the description of the ohmic contact. Even in this case, it was experimentally observed that the electron emission from the coated surface was also easily performed under a low electric field, as in the conductive coating case.

Again in conjunction with FIG. 6, there will be illustrated the threshold voltage between the gate G and the source S, at which the current whose flow is achieved by emitting electrons from the source S under the control of a gate voltage, reaches a critical point. As previously mentioned, the structure of FIG. 6*b* shows a lower threshold voltage than does the structure of FIG. 6*a*. In these structures, the parameters to determine the threshold voltage include the thickness of the insulator between the gate G and the source S and the dielectirc constant of the insulator and the radius of the curvature on the fringe of the source S in contact with the channel.

Figure 8A:
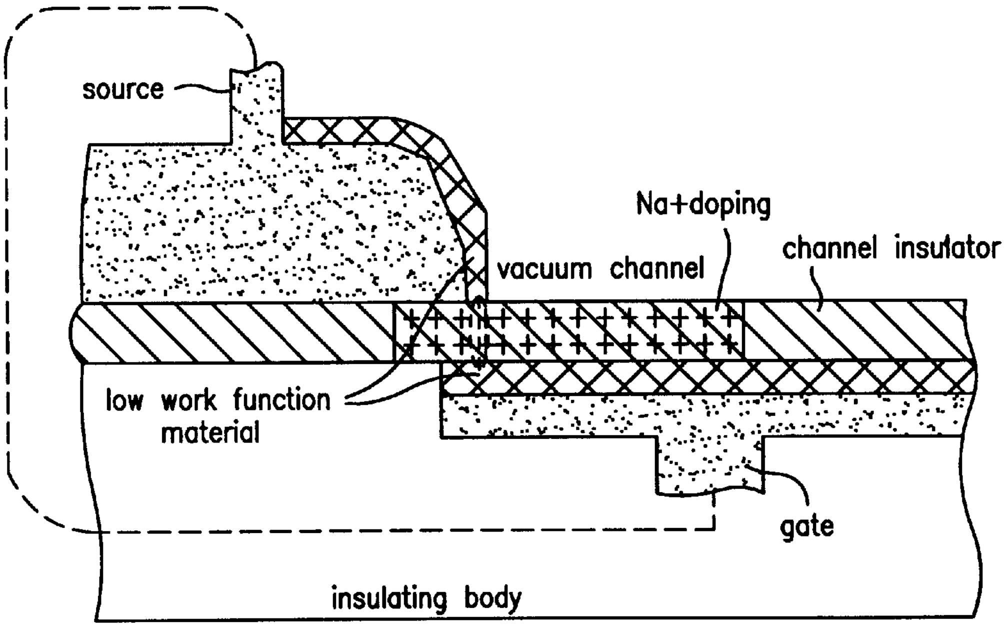
FIGS. 8*a* and 8*b* are schematic views after cations are doped in a gate insulator region in contact with the source and the gate in the structure of FIGS. 6*a* and 6*b*, respectively.
Figure 8B:
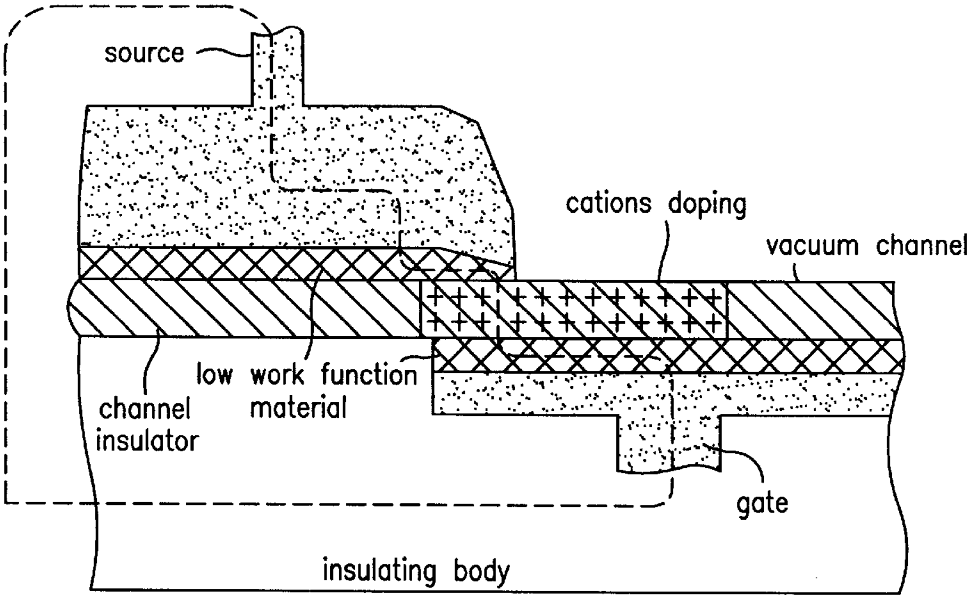

The devices with these structures have threshold voltages which are always greater than zero, and are in an OFF state upon $V_{GS}$=0 because no currents are able to flow. However, the devices are required to be electrically conducted even when $V_{GS}$=0, according to application fields. In fact, in many cases, there are required, at any cost, devices which have a threshold voltage less than zero. It is true of the VFT because, unlike common devices, it has no complementary type (p-type) devices. An example by which devices with a threshold voltage of less than zero (Vt<0) can be produced, is illustrated in FIGS. 8*a* and 8*b*. As shown in these figures, proper cations may be doped into the thin insulator between the gate G—source S. At this time, the Vt becomes a function of the density of the doped cations, the thickness and dielectric constant of the insulator, and the radius of the curvature on the fringe of the source S. Under this circumstance, electrons may be emitted from the source S even at $V_{GS}$=0. Further, it may be possible to control the threshold voltage to some extent simply by doping proper impurities in the low work function material layer on the side of the source S.

In brief, the VFT, like conventional MOSFETs, can be fabricated in the two types, enhancement type and depletion type, by adjusting the threshold voltage into a value larger or smaller that zero. Because the carriers are only electrons in the VFT, there are no devices but the n channel. Therefore, when p channel devices are necessary in designing circuits, it si recommended to use depletion type VFTs rather than SOI-employing PMOS.

Now, a description will be given in an aspect of the nobility of electrons, which determines the operation speed of a device. On account that the electrons which travel a vacuum meet no barriers, but freely move, the concept of mobility which is applied for the electrons moving through conventional semiconductors, is unnecessary. In the case that the gate G is extended form the source S to the drain D as shown in FIGS. 5*a* and 5*b*, the electrons of the channel are attracted toward the surface of the insulator and move along the surface. If so, the electrons do not move freely, but move more slowly on the surface than in a free space. Thus, the concept of mobility cannot help being introduced in this case. Conventional MOSFETs cannot avoid this structure without constructing channels inside semiconductors. In contrast, the VFT devices of the present invention adopt such a design as to overcome this problem.

Figure 9A:
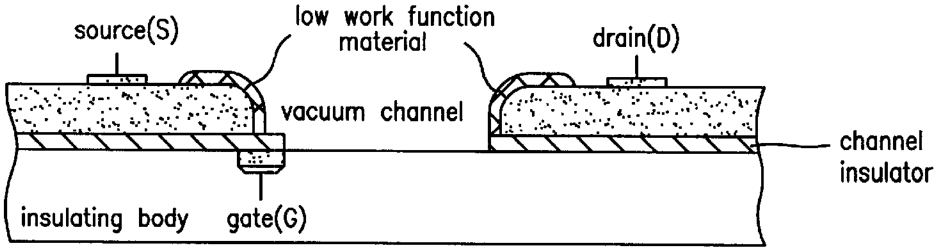
FIGS. 9*a* and 9*b* show the localization of a short gate at either a source or a drain and at both a source and a drain, respectively, in the structure of FIG. 5.

Such as innovative design is introduced in FIG. 9. As shown in FIG. 9*a*, most of the gate G, which is extended to the drain D, is removed while a part of the gate G near the source S is allowed to remain. Alternatively, there may be fabricated devices with the vertical structure concept which will be illustrated with reference to FIG. 15. In these structures, once electrons are emitted from the source S, they move to the drain D without any problem. Further, because the electrons do not drag along the surface of the channel, but fly the space, they can move much faster.

The advantages which can be attained by the structure of the present invention are summarized as follows;

1. The transit of the electrons becomes faster.
2. The capacitance between the gate G-source S is reduced.
3. The 1/f noise of the device is muted.

The small capacitance results from the gate's being reduced in surface area while the muted 1/f noise is attributed to the fact that the surface conditions of the channel do not much affect the transit of the electrons.

To enable electrons to emit from both the source S and the drain D, a gate whose middle region is omitted, instead of a full-length gate, may be constructed. That is, as shown in FIG. 9*a*, gates $G_1$ and $G_2$ are respectively formed at the source S and the drain D. Occasionally, this structure is unavoidable for circuit designing. The structures shown in FIGS. 9*a*, 9*b* and 15*a* to 15*d*, if divided into horizontal and vertical types, operate in the same manner.

Figure 9B:
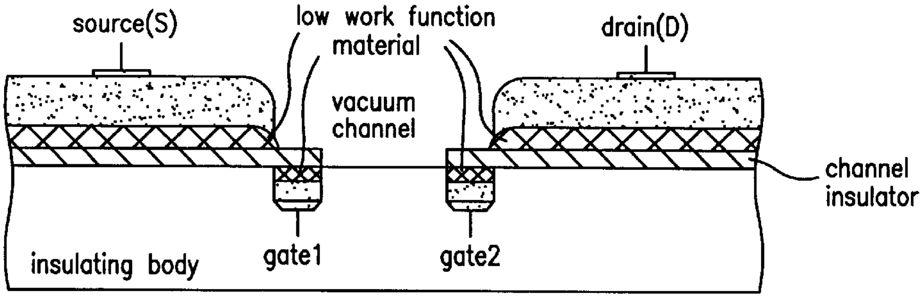
Figure 10:
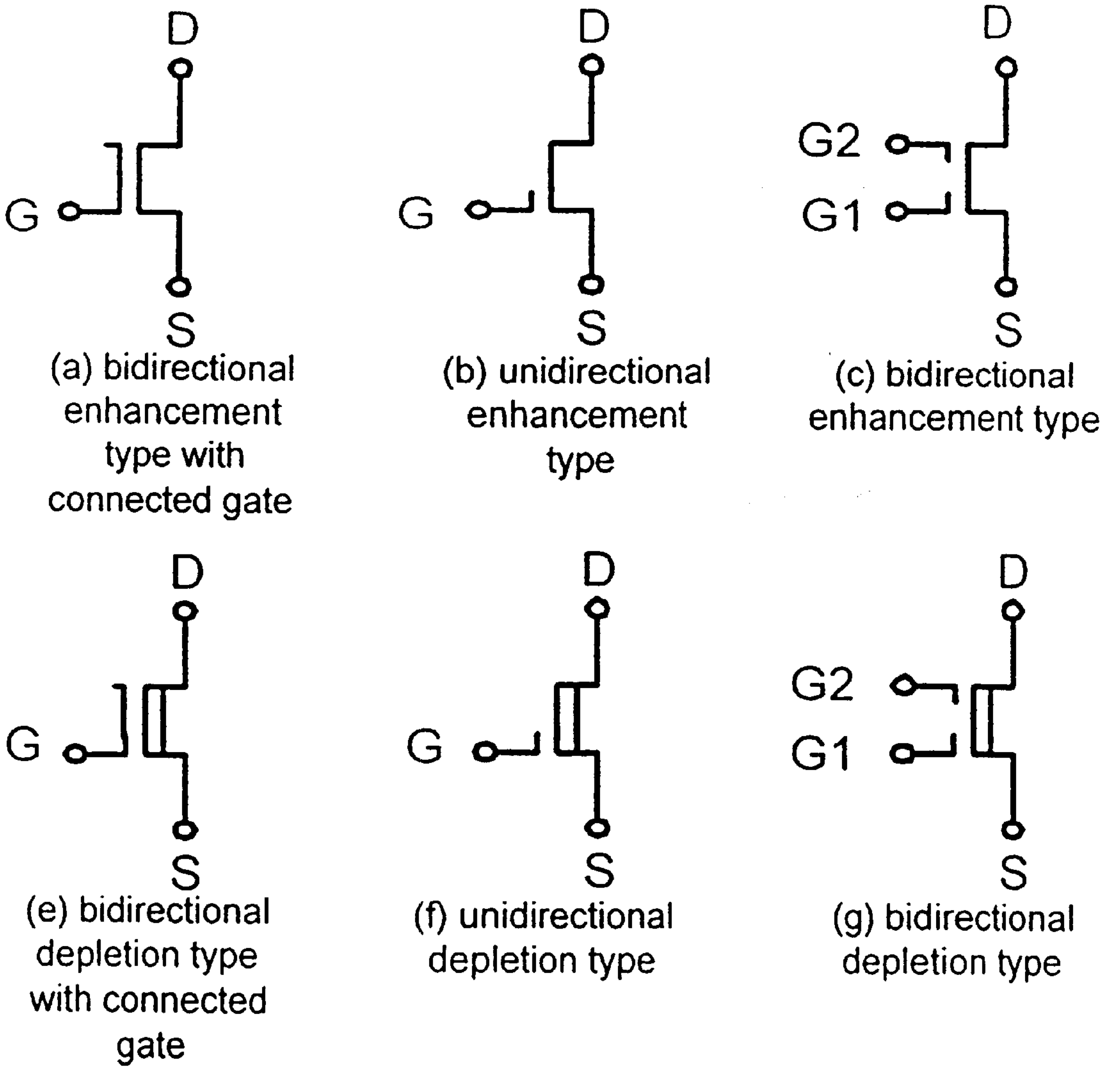
FIG. 10 symbolizes various VFT structure.

FIG. 10 symbolizes the above-illustrated VFT devices. In this figure, the unilateral device symbol is applied for the structures of FIGS. 9*a* and 15, the bilateral device symbol for the structure of FIG. 9*b*, and the gate G-connected device symbol for the structures of FIGS. 5*a* and 5*b*.

One of the factors to determine the switching speed of the device is the time it takes for electrons to move from the source S to the drain S. Account will be taken of this time.

The electrons emitted from the source S travel by the electric field applied to the drain D. Up to the region in which the gate G is present, the electrons move along the insulator surface, so that their moving velocity is affected by the condition of the surface. From the moment when the electrons escape out of the gate region, their moving is ruled by e of the electric field applied to the drain D, but not under the influence of the insulator surface. The time, $T_{transit}$, which it takes for an electron to travel form the source S to the drain D in a vacuum, is known to be expressed in the following mathematical equation II:

$$t_{transit} = \sqrt{\frac{2 \times L^2 \times m}{V_{DS} \times e}} \text{ [s]} \quad \text{[II]}$$

Wherein L is a length from the drain D to the source S, m is the mass of an electron, $t_{transit}$ is a voltage applied across the drain D and the structure S, and e is the charge quantity of an electron.

Figure 11:
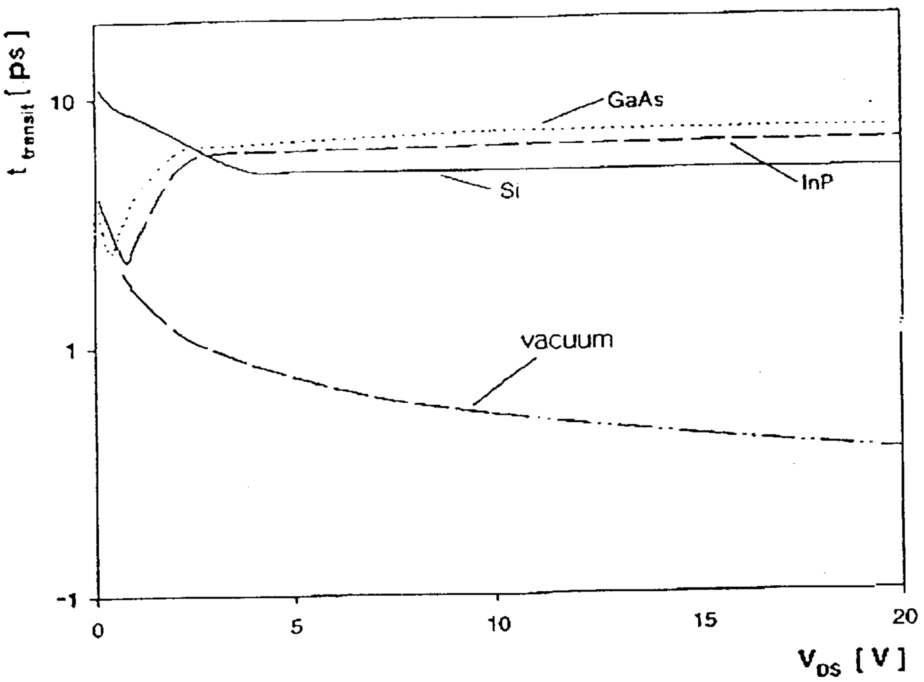
FIG. 11 is a graph in which the time it takes for electrons to transit a gap 0.5 $\mu$m long, is plotted for vacuum, Si, GaAs and InP against the voltage applied between the drain and source.

Referring to FIG. 11, the $t_{transit}$ changes in vacuum, GaAs, InP and Si are plotted against the voltage applied across the drain D and the source S when L=0.5 μm on the basis of the equation 2. When the electric field is less than $5\times10^4$ [V/cm], e.g. $V_{DS}$ is smaller than 2.5V, as mentioned above, electrons move much faster in GaAs and InP than in Si. On the other hand, as a voltage higher than 2.5V is applied, the time it takes for electrons to transit the channel,$t_{transit}$, is almost the same for the three materials. For the vacuum, because the $t_{transit}$ is reversely proportional to $\leftrightarrows\sqrt{V_{DS}}$, the transit time is shortened as $V_{DS}$ is increased. Accordingly, the VFT of the present invention, in which electrons move in a vacuum, is operated much faster than are the conventional devices in which electrons move in Si, GaAs or InP.

Next, small-sign high frequency operation features of the VFT are described in connection to FIG. 12.

Figure 12A:
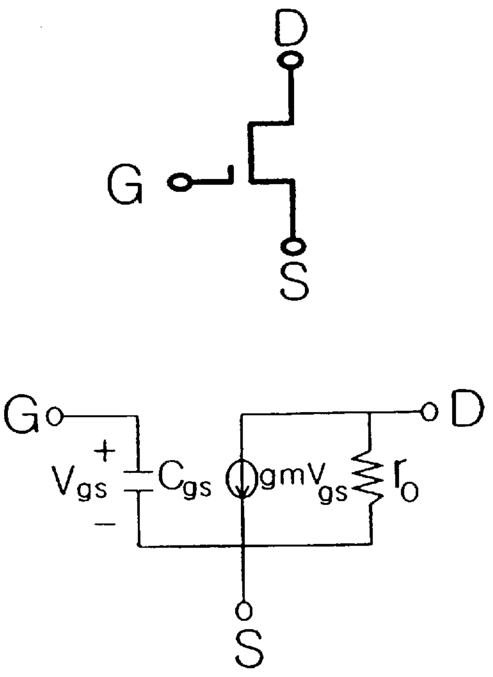
FIGS. 12*a* and 12*b* show high frequency small-signal equivalent models for VFT and MOS, respectively.
Figure 12B:
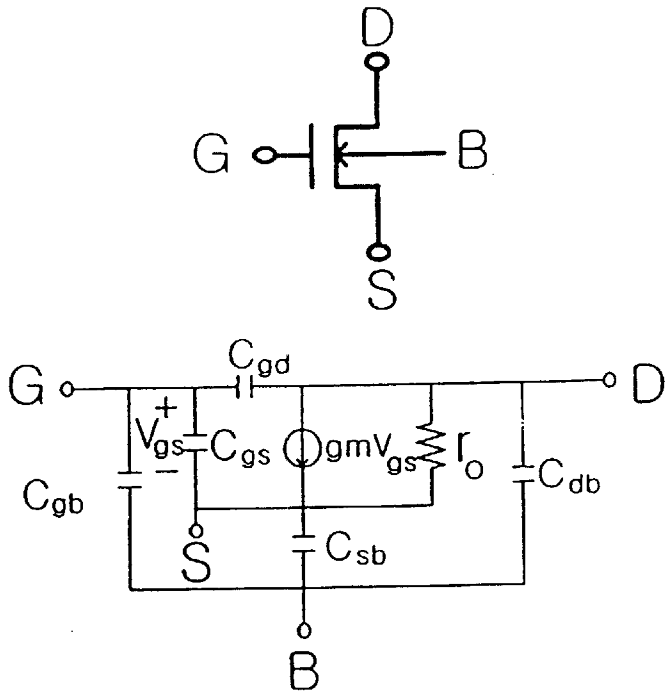

With reference to FIGS. 12*a* and 12*b*, there are small-signal equivalent circuits for a VFT of the present invention and a conventional MOSFET, respectively. One feature of the VFT is absent of undesirable parasitic elements, $C_{gt}$, $C_{st}$, $C_{db}$, and $C_{gd}$, which complicatedly exist in the conventional MOSFET. Another feature of the VFT is found by comparing $C_{gs}$. In the conventional MOSFET, the gate G region must be present over the entire distance between the source S and the drain D whereas, in the VFT, the gate G region may exist as a localized form at the vicinity of the source S. Therefore, the $C_{gs}$ is much smaller in the VFT than in the conventional MOSFET. This is advantages for the upper operation frequency(ft) because it becomes higher as $C_{gs}$ is smaller and $g_m$ is greater.

In addition, by virtue of the absence of the capacitive parasitic elements and the small $C_{gs}$, the VFT has a significant advantages over conventional MOSFETs when constituting digital logic circuits. These capacitive parasitic elements make the switching speed of the device slow as well as consume power upon high speed operation. Therefore, if integrated circuits, such as microprocessors or DSP, are materialized with the VFTs, low power, high speed chips can be fabricated.

Figure 13A:
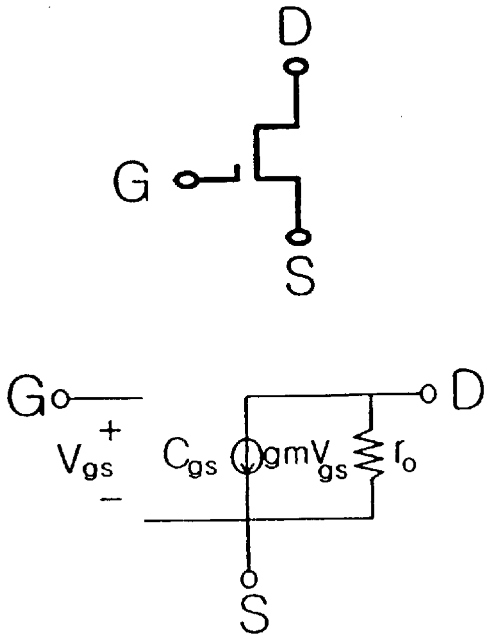
FIGS. 13*a* and 13*b* show leakage current-including low frequency small-signal equivalent models for VFT and MOS respectively.
Figure 13B:
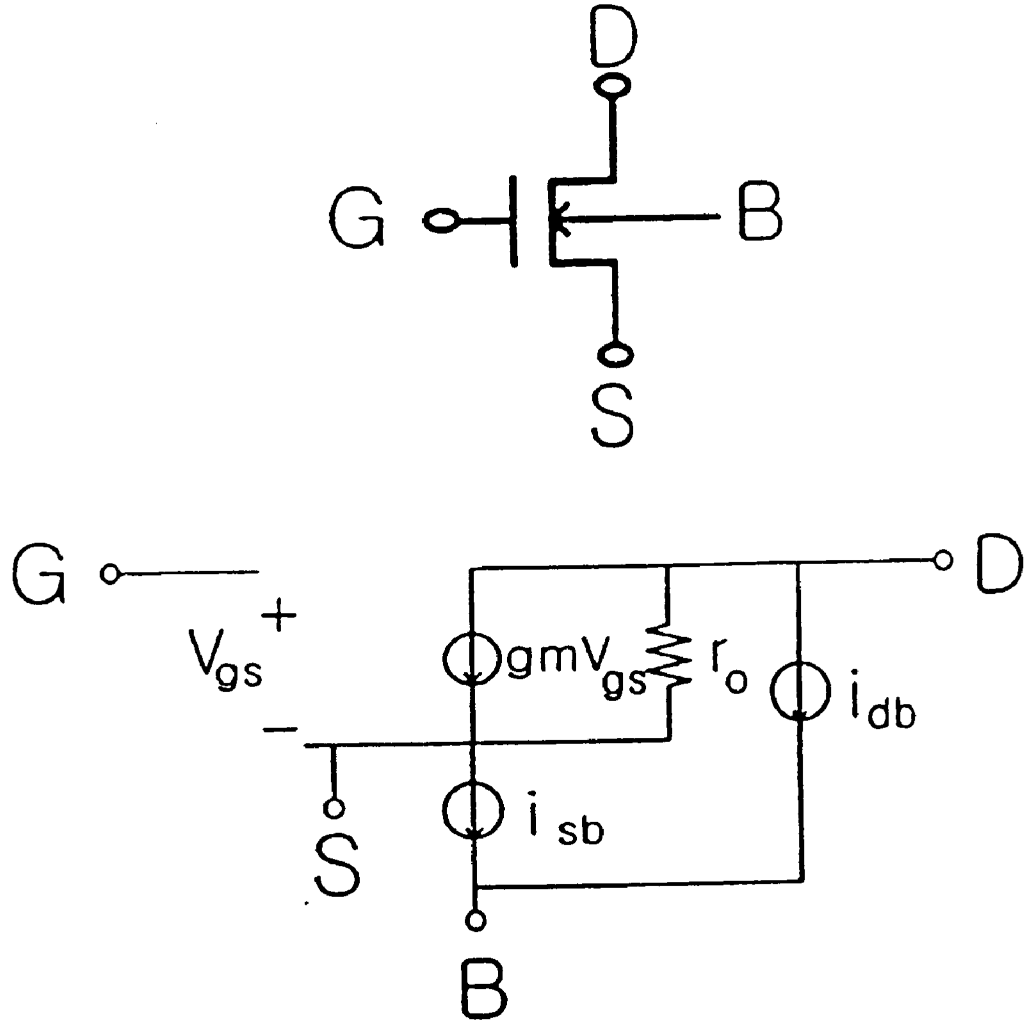

Referring to FIGS. 13*a* and 13*b*, there are leakage current-including low frequency small-signal equivalent circuits for the VFT and a conventional MOSFET, respectively.

In the equivalent circuit of FIG. 13*a*$i_{sb}$ and $i_{db}$ represent leakage current components between a source S and a body B and between a drain S and the body B. These current components are generated when a reverse bias is loaded on the pn junction between the source S and the body B and between the drain D and the body B under normal operation. Generally, this leakage current is so small as to be negligible, but plays an important role when energy is required to be stored in a small capacitor, such as in a DRAM. In particular, the leakage current is seriously problematic in that it is abruptly raised when the temperature of a chip is increased during operation.

In contrast to conventional MOSFETs, the VFT of the present invention exhibits no leakage currents because a source S and a drain are segregated from each other as shown in the equivalent circuit of FIG. 13*a*. Accordingly, for instance, if a DRAM is fabricated with the VFT, very small capacitors are possible, allowing the size of the chip to be reduced. In addition, the fast feature of the VFT makes is possible to fabricate higher speed DRAMs.

Further, the VFT of the present invention may find numerous applications in non-refreshable DRAMs and analog memories. The non-refreshable DRAMs and SRAMs, suggesting that SRAMs can be fabricated with the same integration degree as DRAMs. Because they are refreshed, common memories, such as conventional DRAMs, cannot store information until it is of digital value. In contrast, the VFT of the present invention does not need refreshing by virtue of the absence of leakage currents, but can maintain the initial values. Thus, the VFT capacitates the memories for memorizing analog values. Should there be fabricated memories which can store analog values, they could be applied for neural network circuits.

When high integration degrees are achieved as in microprocessors, interference may take place between neighboring devices in such an open structure as shown in FIGS. 9*a* and 9*b*. For example, where a low drain D voltage is applied in one VFT while a high drain D voltage is applied in an adjacent VFT, the electrons which depart from the source S of the low drain voltage VFT, are under the partial influence of the attractive force of the high drain voltage, so they cannot properly travel through the channel toward their relevant drain D.

The structures as shown in FIGS. 5*a* and 5*b*, in which the gate G is continuously connected over the entire distance between the source S and the drain D, are very low in the possibility that the channel charges of one VFT deviate from their own channel and are attracted to the drain D or source S of an adjacent high voltage VFT. For all that, it is difficult to prevent such electron deviation when devices switch as in digital logic circuits.

Below, structures in which no influence arise between adjacent devices under any circumstance will be discussed.

Figure 14:
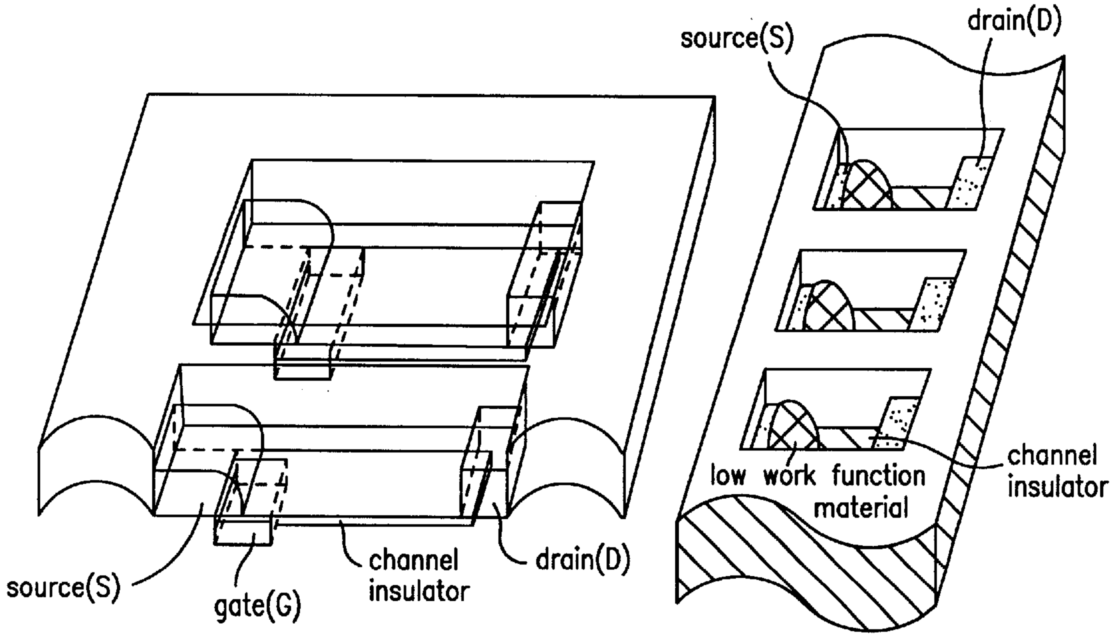
FIG. 14 shows a part of an integrated circuit composed of devices which are segregated from one another by insulating trenches.

FIG. 14 shows a structure in which each device is positioned in an individual room which is formed by selectively etching. Since the walls formed by the etching serve as complete septal walls on front, rear, right and left sides, if the top of the room is closed, each device can be completely segregated. This structure is expected to show a mobility similar to that as in FIG. 9 and can be applied for mass scale integrated circuits with no problems.

Figure 15A:
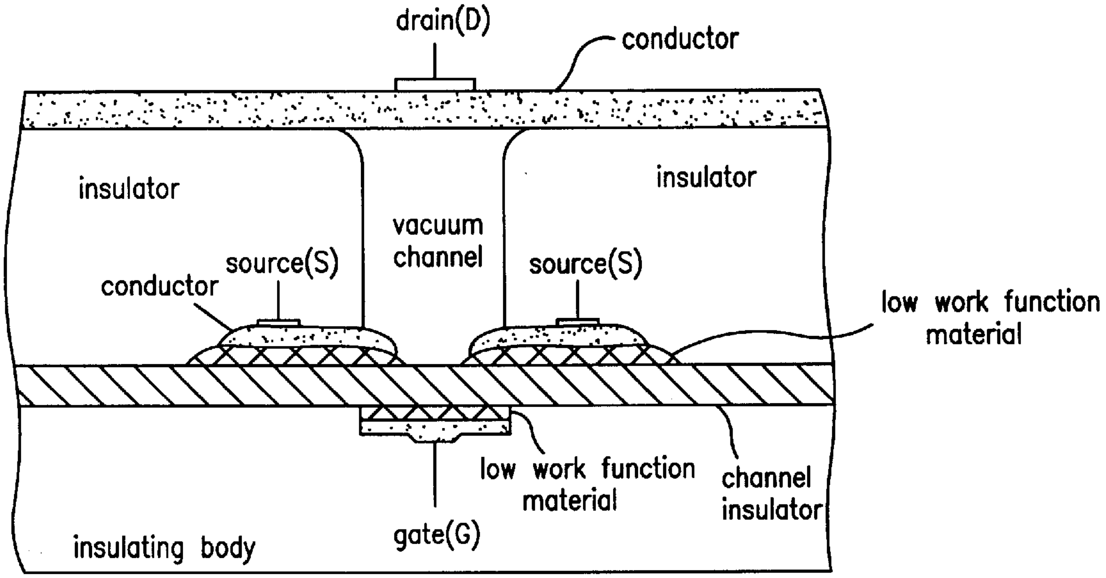
FIGS. 15*a*, to 15*c* are schematic cross sectional views showing vertical type VFT structures according to the present invention.
Figure 15B:
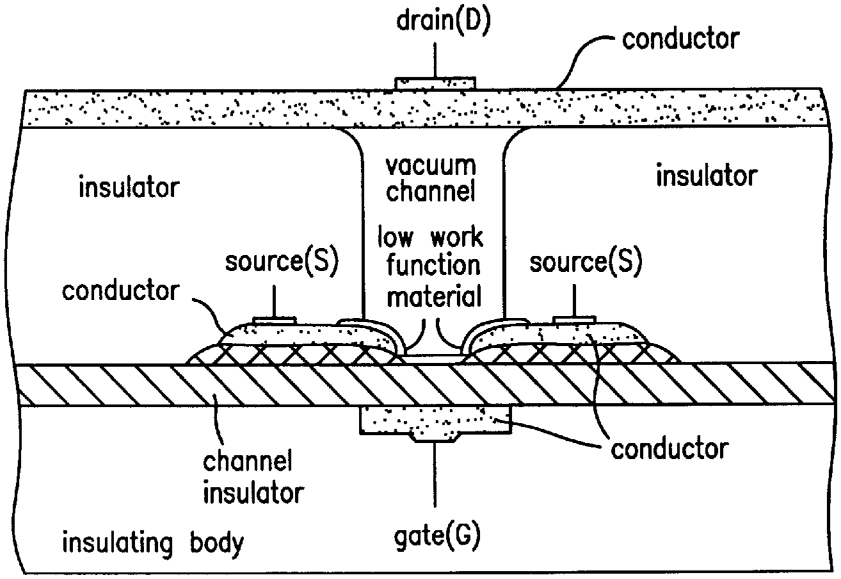
FIG. 15*d* shows a vertical type VFT structure in which a non-conductive low work function material is coated over a region including opposite sources and a channel therebetween.
Figure 15C:
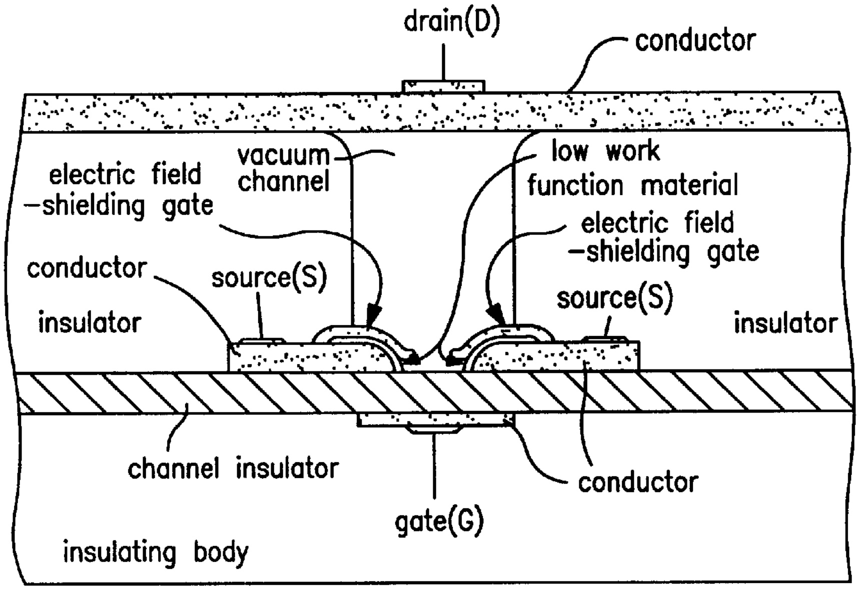
Figure 15D:
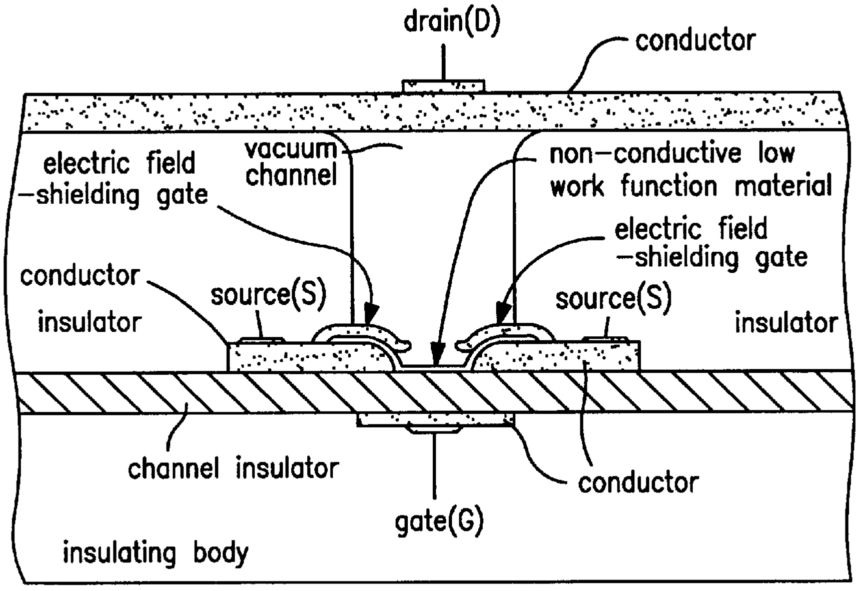

FIGS. 15*a* and 15*d* show trench VFT structures, not horizontal, but vertical, which are fabricated by use of a process similar to that for fabricating trench capacitors for a DRAM. Such vertical structures allow the emitted electrons to show the fastest mobility because the electrons travel a vacuum without the influence of the metal or insulator surface.

Such vertical structure are particularly suitable to high frequency power devices. Even in the case of applying a relatively high voltage to the Drain D, the electron emission spot on the side of the source can be effectively protected by an electric field shielding gate, connected to the source S, in the structure of FIG. 15*c* or 15*d*. Like the structure of FIG. 5*d*, the structure of FIG. 15*d* uses a non-conductive low work function material which is coated over a channel region and sources S and has an advantage of being fabricated with ease.

Besides the VFT's various structures and their characteristics, simple circuits which recruit the VFTs will be considered.

Figure 16A:
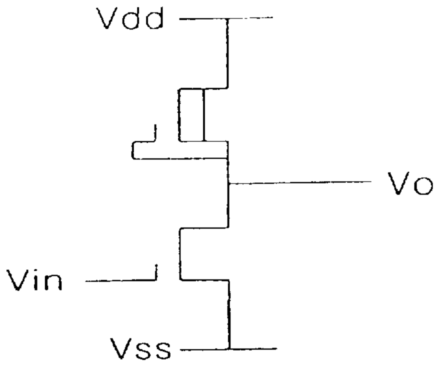
FIGS. 16*a* and 16*b* show a simple inverter circuit and a output buffer-including inverter circuit, both designed with VFT devices.
Figure 16B:
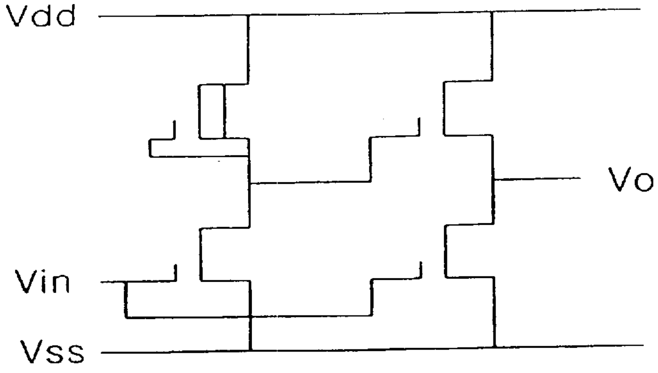
Figure 16C:
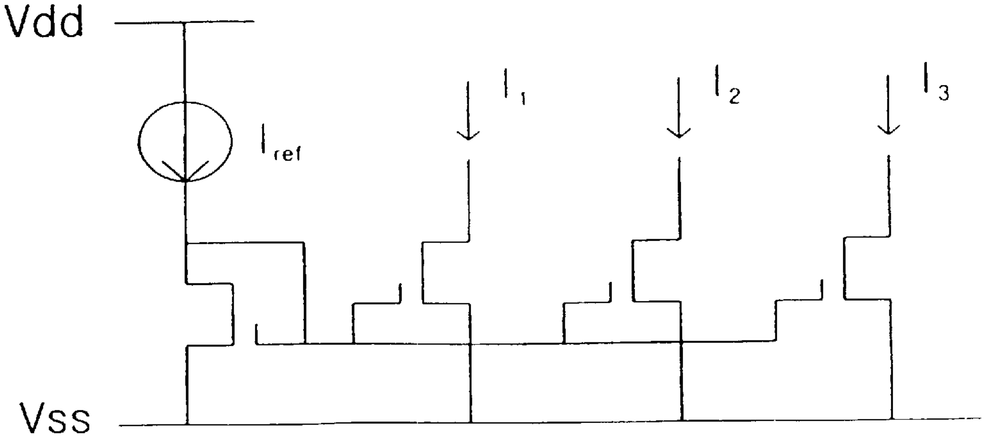
FIG. 16*c* shows a multiple current source circuit designed with VFT devices.
Figure 6A:
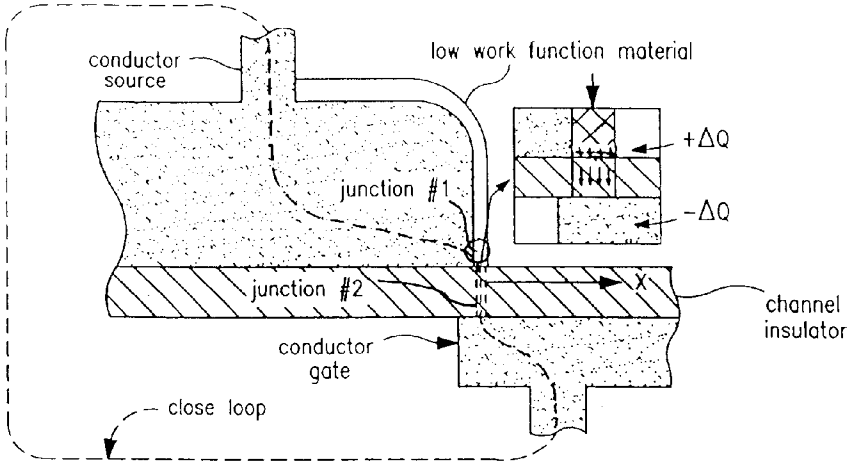
Figure 6B:
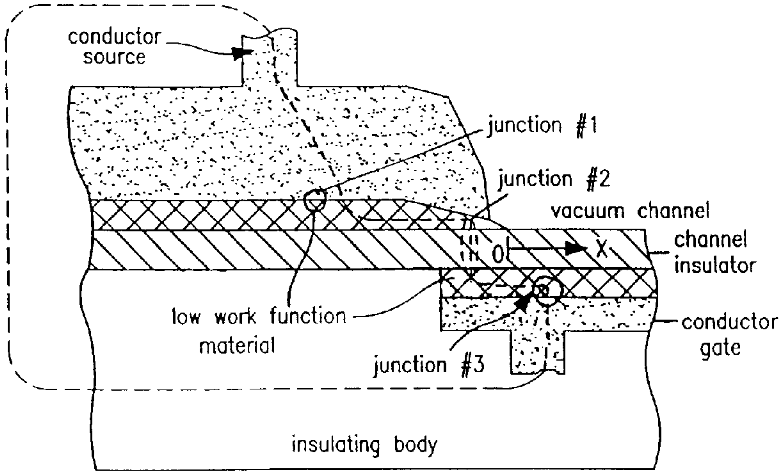
Figure 7:
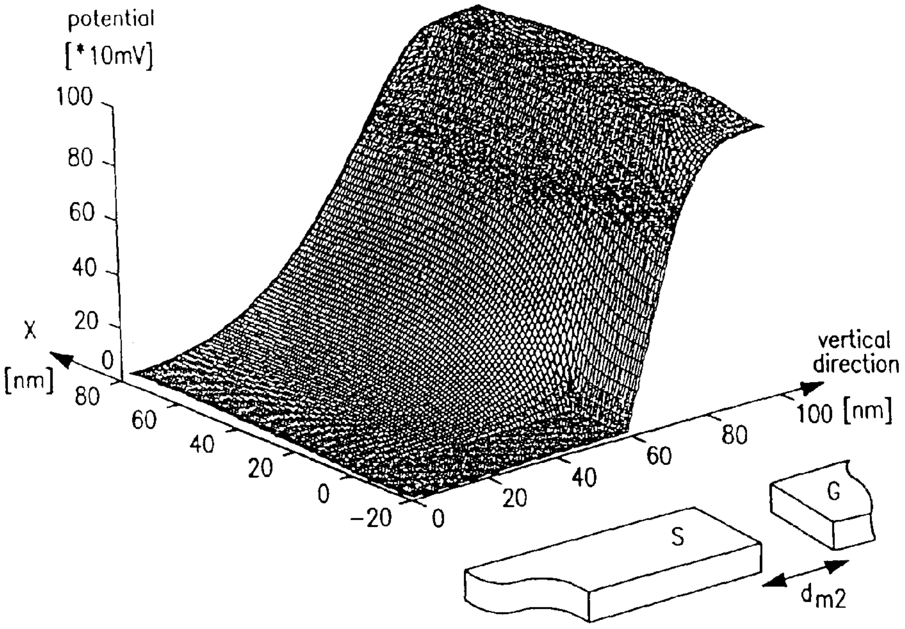
Figure 8A:
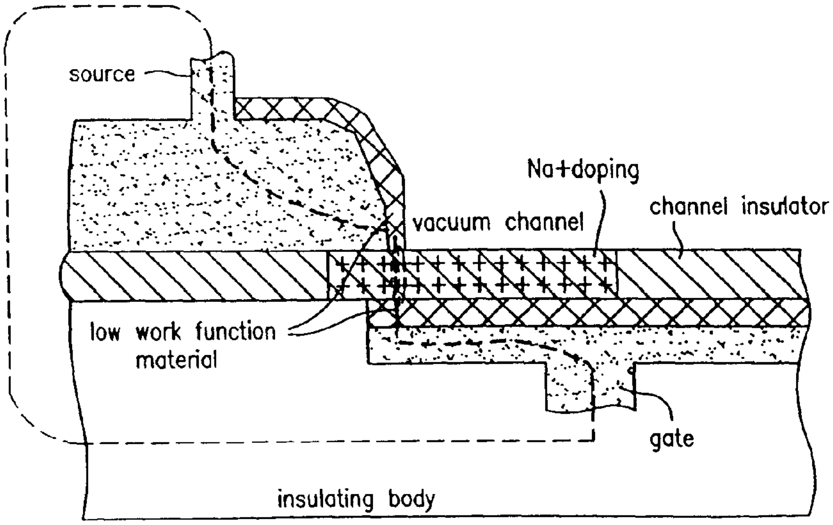
Figure 15A:
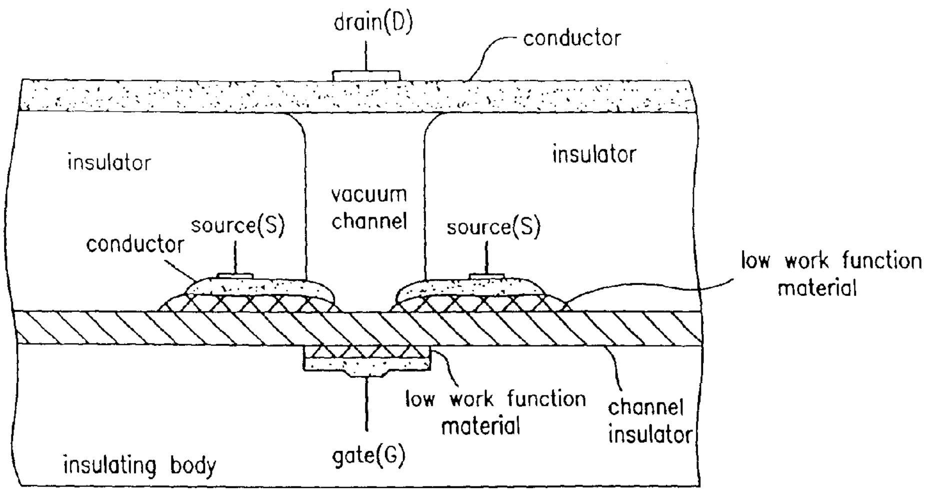
Figure 15B:
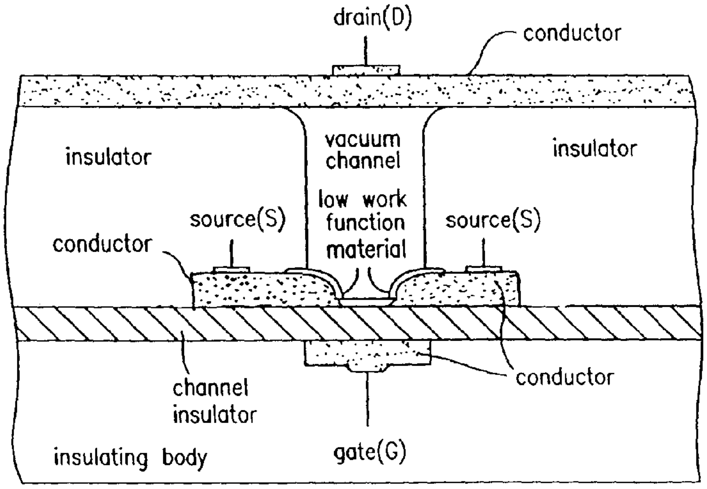

In FIGS. 16*a* and 16*b*, an enhancement type VFT and a depletion type VFT are used to design a simple inverter circuit and an inverter circuit having output buffers, respectively. Instead of the depletion VFT, a p channel SOI MOSFET may be recruited. FIG. 16*c* is a circuit showing multiple current sources. FIG. 16*c* is a circuit showing multiple current sources. Like a MOSFET circuit, not only can the VFT circuit allow equal currents to flow where the same $V_{GS}$ is applied, but also the VFT circuit can control the quantity of the current which flows through each device, by making the size of each device different. The control of the current which flows through each device, can be also approached by changing the material coated on each device of by varying the thickness of the insulator used.

As described hereinbefore, the present invention can be operated at lower voltages than can conventional MOS, SOI, GaAs, InP devices. In addition, the present invention is able to operate at high speeds and be highly integrated with ease, bringing about an effect of making it possible to operate the integrated circuits at low voltages and at high speeds and thus, to apply them for super speed microprocessors, super computers, DSP, memory devices and the like. Another advantage of the present invention is that it can find applications in power amplification devices of high frequency and low noise amplification devices for output or input terminals.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A flat type vacuum field transistor, comprising:

a source and a drain, made of conductors which stand at a predetermined distance apart on a thin channel insulator with a vacuum channel therebetween;

a gate, made of a conductor, which is formed with a width below the source and the drain, said channel insulator functioning to insulate the gate from the source and the drain; and an insulating body, which serves as a base for propping up the channel insulator and the gate, wherein proper bias voltages are applied among the gate, the source and the drain to enable electrons to be field emitted from the source through the vacuum channel to the drain.

2. The flat type vacuum field transistor as set forth in claim 1, further comprising a low work function material at the contact regions between the source and the vacuum channel and between the drain and the vacuum channel.

3. The flat type vacuum field transistor as set forth in claim 2, wherein the low work function material is extended over the channel insulator which is in contact with the vacuum channel.

4. The flat type vacuum field transistor as set forth in claim 1, further comprising a low work function material between the gate and the channel insulator.

5. The flat type vacuum field transistor as set forth in claim 1, wherein cations are doped in the channel insulator at the vicinity of the gate and the source to realize a depletion type device.

6. The flat type vacuum field transistor as set forth in claim 1, wherein the gate is localized at either the source or the drain.

7. The flat type vacuum field transistor as set forth in claim 1, wherein the gate is discontinuous and localized at both the source and the drain.

8. The flat type vacuum field transistor as set forth in claim 1, further comprising electric field-shielding gate on the side of the source in such a way that the electric field-shielding gate covers the area of the source, except for an electron emission spot at the vicinity of which the source, and the vacuum channel and the channel insulator are in contact with one another, thereby abating the influence of the electric field formed by the voltage applied to the drain on the electron emission spot.

9. The flat type vacuum field transistor as set forth in claim 1, wherein the flat type vacuum field transistor is surrounded by insulating septal walls to prevent the influence of external fields on electrons' movement from the source to the drain, whereby the electrons cannot be deviated from one transistor to another adjacent transistor when the transistor are integrated.

10. The flat type vacuum field transistor as set forth in claim 1, further comprising an insulating plate, said insulating plate having a plurality of trenches in each of which one vertical type vacuum field transistor device is installed so that the insulating trench walls prevent the interference between the transistor devices integrated, thereby allowing electrons not to deviate from one device to another neighboring device.

11. A vertical type vacuum field transistor, comprising;

a conductive, continuous circumferential source with a void center, formed on a channel insulator;

a conductive gate formed below the channel insulator, extending across the source;

an insulating body for serving as a base to support the gate and the channel insulator;

insulating walls which stand over the source, forming a closed vacuum channel; and a drain formed over the vacuum channel, wherein proper bias voltages are applied among the gate, the source and the drain to enable electrons to be field emitted from the source through the vacuum channel to the drain.

12. The vertical type vacuum field transistor as set forth in claim 11, further comprising a low work function material on the source.

13. The vertical type vacuum field transistor as set forth in claim 12, wherein the low work function material is extended over the channel insulator which is in contact with the vacuum channel.

14. The vertical type vacuum field transistor as set forth in claim 11, further comprising a work function material between the gate and channel insulator.

15. The vertical type vacuum field transistor as set forth in claim 11, further comprising electric field-shielding gate on the side of the source in such a way that the electric field-shielding gate covers the area of the source, except for an electron emission spot at the vicinity of which the source, the vacuum channel and the channel insulator are in contact with one another, thereby abating the influence of the electric field formed by the voltage applied to the drain on the electron emission spot.

16. The vertical type vacuum field transistor as set forth in claim 11, further comprising an insulating plate, said insulating plate having a plurality of trenches in each of which one vertical type vacuum field transistor device is installed so that the insulating trench walls prevent the interference between the transistor devices integrated, thereby allowing electrons not to deviate from one device to another neighboring device.

* * * * *

UNITED STATES PATENT AND TRADEMARK OFFICE
CERTIFICATE OF CORRECTION

PATENT NO. : 6,437,360 B1
DATED : August 20, 2002
INVENTOR(S) : Gyu Hyeong Cho et al.

It is certified that error appears in the above-identified patent and that said Letters Patent is hereby corrected as shown below:

Drawings,
Delete Figures 6a, 6b, 8a and 15b and substitute therefor the attached corrected Figures 6a, 6b, 8a and 15b.

Signed and Sealed this

Sixth Day of May, 2003

JAMES E. ROGAN
*Director of the United States Patent and Trademark Office*